United States Patent
Tooyama et al.

(10) Patent No.: US 7,788,197 B2
(45) Date of Patent: Aug. 31, 2010

(54) TEACHING APPARATUS AND METHOD OF TEACHING A WAFER CARRYING APPARATUS A TARGET POSITION FOR PLACING AND REMOVING SEMICONDUCTOR WAFERS ON AND OFF A WAFER BOAT USING AN IMAGING DEVICE AND DISTANCE SENSOR

(75) Inventors: Toshihiro Tooyama, Kumamoto (JP); Hajime Samano, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 971 days.

(21) Appl. No.: 11/592,244

(22) Filed: Nov. 3, 2006

(65) Prior Publication Data

US 2007/0117228 A1    May 24, 2007

(30) Foreign Application Priority Data

Nov. 21, 2005   (JP)   ............................. 2005-336054

(51) Int. Cl.
G05B 19/18 (2006.01)
G06F 19/00 (2006.01)

(52) U.S. Cl. ............................. 706/45; 700/56; 700/58; 700/59; 700/47; 700/121

(58) Field of Classification Search ................... 706/45
See application file for complete search history.

(56) References Cited

U.S. PATENT DOCUMENTS

2002/0000359 A1* 1/2002 Asai et al. ................ 198/346.2
2003/0231950 A1* 12/2003 Raaijmakers ............... 414/800
2004/0075822 A1* 4/2004 Hattori ........................ 355/72

FOREIGN PATENT DOCUMENTS

| JP | 09-008098 | 1/1997 |
| JP | 2004-241730 | 8/2004 |

OTHER PUBLICATIONS

Kim et al., Sensor-Based Navigation Control and Calibration of a Wafer-Handling Mobile Robot, 1995.*

* cited by examiner

Primary Examiner—Donald Sparks
Assistant Examiner—Nathan H Brown, Jr.
(74) Attorney, Agent, or Firm—Young & Thompson

(57) ABSTRACT

A teaching apparatus and a teaching method that facilitates accurately setting a retainer at a target position, and minimizes troublesome steps in the manufacturing process, are to be provided. The teaching apparatus includes a first member held by the retainer of the carrying apparatus, a second member attached to the wafer boat (mounting rack) so as to oppose the first member held by the retainer when the retainer is set close to the target position, an output unit, and an arithmetic unit. The first member includes a distance sensor that generates a sensor signal representing a distance between the distance sensor and a surface of the second member opposing the first member. On the surface of the second member opposing the first member, a reference mark A is provided. The first member includes an imaging device that shoots an image including the reference mark A, and generates image data.

6 Claims, 16 Drawing Sheets

TEACHING APPARATUS AND METHOD OF TEACHING A WAFER CARRYING APPARATUS A TARGET POSITION FOR PLACING AND REMOVING SEMICONDUCTOR WAFERS ON AND OFF A WAFER BOAT USING AN IMAGING DEVICE AND DISTANCE SENSOR

This application is based on Japanese patent application No. 2005-336054, the content of which is incorporated hereinto by reference.

BACKGROUND

1. Technical Field

The present invention relates to a teaching apparatus and a teaching method.

2. Related Art

When performing a process such as cleaning or heat treatment of semiconductor wafers, conventionally a wafer boat having slots that support a plurality of sheets of semiconductor wafers is employed. The semiconductor wafers are respectively inserted in each slot of the wafer boat for processing the plurality of semiconductor wafer sheets at a time. Upon completion of the process, the semiconductor wafer sheets are removed from the wafer boat.

For thus placing and removing the semiconductor wafers on and off the wafer boat, a carrying apparatus is employed.

To insert a semiconductor wafer held by a retainer of a carrying apparatus into a slot of a boat, conventionally an operator visually adjusts the positional relationship between the outer edge of the semiconductor wafer and the slot of the wafer boat. By such method, however, it is difficult to precisely insert the semiconductor wafer into the slot of the wafer boat. Actually the outer edge of the semiconductor wafer often collides with the wafer boat thus getting chipped or cracked.

Likewise, when removing the semiconductor wafer from the wafer boat, it is difficult to accurately adjust the position of the retainer of the carrying apparatus with that of the semiconductor wafer placed on the wafer boat, and the semiconductor wafer often suffers chipping and cracking.

Accordingly, methods of teaching the carrying apparatus a target position with respect to the wafer boat have been developed. A few examples of which are cited hereunder.

JP-A No. H09-8098 proposes, for a supporting boat (wafer boat) having a plurality of slots in a vertical heat-treatment apparatus, establishing a three-dimensional coordinate of an uppermost slot, a lowermost slot and at least one of the remaining slots, and storing such coordinate in the carrying apparatus. The carrying apparatus calculates a three-dimensional coordinate of said other slots based on the stored three-dimensional coordinate. And based on the calculated three-dimensional coordinate, the retainer of the carrying apparatus is driven, so as to insert semiconductor wafers into each slot one by one.

Also, JP-A No. 2004-241730 proposes an automatic teaching apparatus 108 as shown in FIGS. 15 and 16, including a dummy substrate 100 on which an x-direction slit 101 and a y-direction slit 102 are provided in predetermined positions, a sensor board 106 including an x-direction detection sensor 103 and a y-direction detection sensor 104 that respectively output a position signal corresponding to the slits 101, 102, and a z-direction detection sensor 105 that outputs a z-direction position signal, and a sensor signal processor 107.

In this automatic teaching apparatus 108, after the sensor board 106 is placed at a reference position in the wafer boat 109 (cassette module chamber), a robot arm (retainer) holding a dummy substrate 100 is located on the sensor board 106. Then the position of the dummy substrate 100 is determined such that the relationship between a position of the X-direction detection sensor A1(X1, Y1), a position of the Y-direction detection sensor A2 (X2, Y2), which are from the reference position $O_1$ of the sensor board 106 coinciding with the central axis C, and a position of the X-direction detecting slit A1'(X1', Y1'), a position of the Y-direction detecting slit A2' (X2', Y2'), which is from the reference position $O_1$' of the dummy substrate 100 coinciding with the central axis C, satisfies A1=A1' and A2=A2', respectively.

The position that satisfies A1=A1' and A2=A2' is then stored in the carrying apparatus having the robot arm.

[Patented document 1] JP-A No. H09-8098

[Patented document 2] JP-A No. 2004-241730

The techniques according to the cited documents, however, still have a room for improvement in the following aspects.

Regarding the technique according to the patented document 1, when obtaining the three-dimensional coordinate of the uppermost slot, the lowermost slot and at least one of the remaining slots, actually the retainer is manually driven to be located close to the slot and positioned, and the three-dimensional coordinate of the retainer close to the slot is stored.

Here, the patented document 1 does not provide a specific method of positioning the retainer with respect to the slot.

On the other hand, with the technique according to the patented document 2, the width of the x-direction slit 101 and the y-direction slit 102 delimits the detection accuracy of a position of the X-direction detecting slit A1' and a position of the Y-direction detecting slit position A2'.

In other words, the positioning accuracy of the dummy substrate 100 with respect to the sensor board 106 depends on the width of the x-direction slit 101 and the y-direction slit 102. Hence the widths of the x-direction slit 101 and the y-direction slit 102 have to be formed with high accuracy. This requires a complicated fabricating process for the dummy substrate 100 of the automatic teaching apparatus 108.

SUMMARY OF THE INVENTION

According to the present invention, there is provided a teaching apparatus to be used for teaching a carrying apparatus a target position at which a retainer of the carrying apparatus holding an object to be carried is to make access to a mounting rack on which the object is to be placed, comprising a first member held by the retainer; a second member attached to the mounting rack and disposed so as to oppose the first member held by the retainer when the retainer is located close to the target position; an output unit; and an arithmetic unit; wherein at least one of the first and second members includes a distance sensor that generates a sensor signal representing a distance between the distance sensor and an opposing surface of the other member opposing the one member; at least one of the opposing surface of the other member, and that of the one member opposing the opposing surface of the other member, is provided with a reference mark, and one of the first and second members which is opposing the member with the reference mark includes an imaging device that shoots an image including the reference mark and generates image data; the arithmetic unit calculates a distance represented by the sensor signal based on the sensor signal generated by the distance sensor; the output unit outputs a calculation result given by the arithmetic unit, and outputs a difference in a position of the reference mark obtained from the image data generated by the imaging device and a position of the reference mark in an image shot by the imaging device when the retainer is set at the target position.

According to the present invention, there is also provided a teaching apparatus to be used for teaching a carrying apparatus a target position at which a retainer of the carrying apparatus holding an object to be carried is to make access to a mounting rack on which the object is to be placed, comprising a first member held by the retainer; a second member attached to the mounting rack and disposed so as to oppose the first member held by the retainer when the retainer is located close to the target position; an output unit; an arithmetic unit; a first storage unit; and a first detector; wherein at least one of the first and second members includes a distance sensor that generates a sensor signal representing a distance between the distance sensor and an opposing surface of the other member opposing the one member; at least one of the opposing surface of the other member, and that of the one member opposing the opposing surface of the other member, is provided with a reference mark, and one of the first and second members opposing the member with the reference mark includes an imaging device that shoots an image including the reference mark and generates image data; the first storage unit stores a position of the reference mark in an image shot by the imaging device when the retainer is set at the target position; the first detector detects a difference in a position of the reference mark obtained from the image data generated by the imaging device and the position of the reference mark stored in the first storage unit; the arithmetic unit calculates a distance represented by the sensor signal based on the sensor signal generated by the distance sensor; and the output unit outputs a calculation result given by the arithmetic unit, and a detection result given by the first detector.

It is to be noted that the arithmetic unit may calculate only the distance represented by the sensor signal generated by the distance sensor, or a difference between the distance represented by the sensor signal generated by the distance sensor and the distance between the distance sensor and the opposing surface of the other member defined when the retainer is set at the target position.

In other words, the calculation result from the arithmetic unit output by the output unit may be the distance represented by the sensor signal generated by the distance sensor, or a difference between the distance represented by the sensor signal generated by the distance sensor and the distance between the distance sensor and the opposing surface of the other member defined when the retainer is set at the target position.

In the teaching apparatus thus constructed, at least the opposing surface of one of the first and second members, which is opposing the other member, is provided with a reference mark, and one of the first and second members opposing the member with the reference mark includes an imaging device that shoots an image including the reference mark and generates image data.

And since the position of the reference mark in the image shot when the retainer is set at the target position is stored in the first storage unit, the first detector can acquire the image data generated by the imaging device, and recognize a difference in the position of the reference mark in the image obtained from the image data and the position of the reference mark in the image shot when the retainer is set at the target position.

Then by adjusting the position of the retainer based on the difference thus recognized, the coordinate position of the retainer and the coordinate position of the target position can be made to coincide in the opposing surface (for example, in the X-Y plane) in which the reference mark is provided.

Also, at least one of the first and second members includes a distance sensor that generates a sensor signal representing a distance between the distance sensor and an opposing surface of the other member. The teaching apparatus includes an arithmetic unit that calculates the distance represented by the sensor signal, based on the sensor signal generated by the distance sensor.

Such structure allows acquiring a distance in a direction intersecting the opposing surface, through the distance sensor and the arithmetic unit.

Accordingly, the distance between the distance sensor and the opposing surface defined when the retainer is set at the target position may be got in advance, so that upon comparison of the distance between the distance sensor and the opposing surface defined when the retainer is set at the target position and the distance acquired through the distance sensor when the retainer is located close to the target position, a difference between those distances can be acquired.

By driving the retainer based on the acquired difference, the coordinate position of the retainer in a direction (for example, a direction of Z-axis) intersecting the surface on which the reference mark is provided (for example, in the X-Y plane) and the coordinate position of the target position can be made to coincide.

Then upon storing the position of the retainer in the carrying apparatus under the state that the retainer is thus set at the target position by the teaching apparatus according to the present invention, the teaching process is completed.

According to the present invention, the retainer is set at the target position utilizing the distance sensor and the imaging device, unlike the conventional technique of employing the dummy substrate with the slits. This saves the process of forming the slits with high accuracy, thereby minimizing troublesome steps in the manufacturing process of the teaching apparatus.

Further, in the case of employing the dummy substrate with the slits for positioning according to the conventional technique, the slits' widths have to be formed with highly accuracy in order to secure sufficient positioning accuracy. However practically it is difficult to form the slits' width with accuracy. This naturally leads to difficulty in achieving the expected accuracy in the positioning of the retainer.

In contrast, according to the present invention, the distance sensor and the imaging device are employed for setting the retainer at the target position. Thus, employing the distance sensor and the imaging device of a high precision grade enables setting the retainer at the target position with high accuracy.

The present invention also provides a method of teaching a carrying apparatus a target position at which a retainer of the carrying apparatus holding an object to be carried is to make access to a mounting rack on which the object is to be placed, comprising causing the retainer to hold a first member; attaching a second member to the mounting rack; moving the retainer to the proximity of the target position thus placing the first and second members so as to oppose each other; measuring, with a distance sensor provided to one of the first and second members, a distance between the distance sensor and a surface of the other member opposing the one member; shooting a reference mark provided to at least one of the opposing surface of the other member and that of the one member opposing the opposing surface of the other member, and acquiring an image, with an imaging device provided to one of the first and second members opposing the member having the reference mark; detecting a difference between the distance measured in the measuring a distance and the distance between the distance sensor and the opposing surface of the other member defined when the retainer is set at the target position; detecting a difference in a position of the reference mark in the image acquired in the acquiring an image and a position of the reference mark in an image shot by the imaging device when the retainer is set at the target position; adjusting the position of the retainer based on a detection result in the steps of detecting a difference; and storing an adjusted position of the retainer in the carrying apparatus.

Thus, the present invention provides a teaching apparatus and a teaching method that facilitates accurately setting a retainer at a target position, and minimizes troublesome steps in the manufacturing process.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of the present invention will be described referring to the accompanying drawings.

Referring first to FIGS. 1 to 7, a structure of a carrying apparatus 1 and a wafer boat 2 (mounting rack) will be described.

The carrying apparatus 1 serves to convey a plurality of sheets of wafers W (object to be carried) at a time. The carrying apparatus 1 is used to place a plurality of sheets of wafers W at a time on the wafer boat 2 located in a bath 3 such as a wet etching bath, and to remove the wafers W from the wafer boat 2 at a time.

Figure 2:
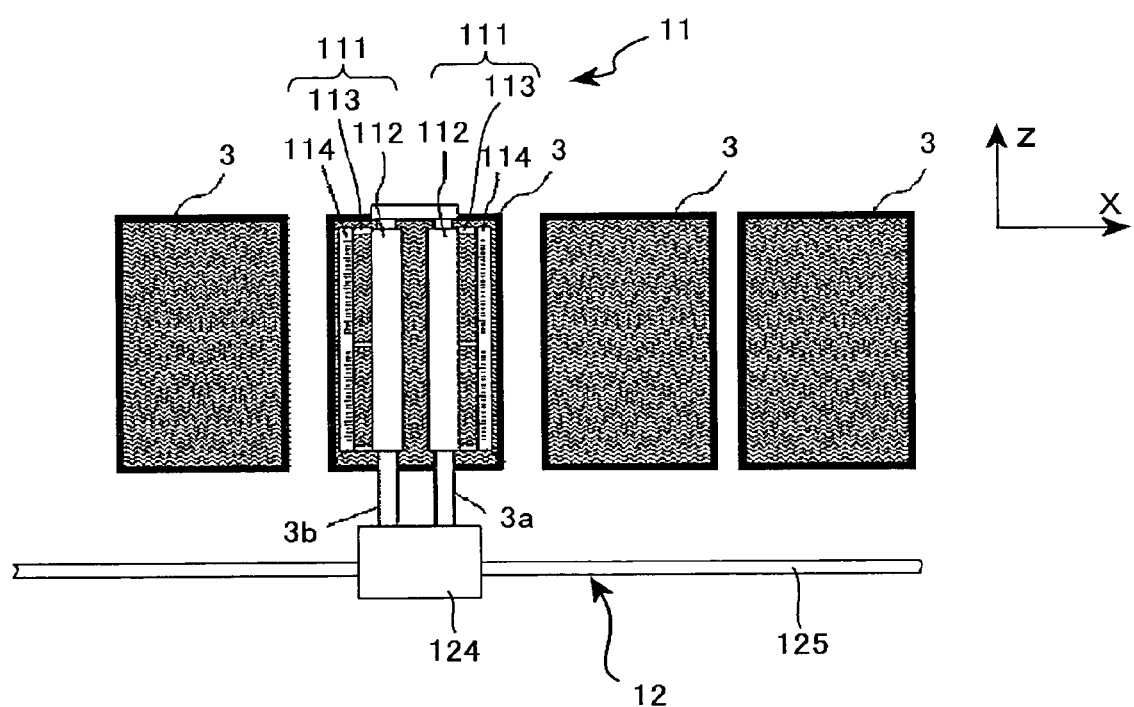
FIG. 2 is a plan view showing the carrying apparatus, the mounting rack and a bath.

In this embodiment, the wafers W are held by the carrying apparatus 1 and moved among the baths 3 located at a predetermined interval, as shown in FIG. 2.

The carrying apparatus 1 includes a retainer 11 and a driving unit 12 that drives the retainer 11.

The retainer 11 includes a pair of retainer main bodies 111 disposed to oppose each other.

The retainer main bodies 111 include a rod-shaped sliding unit 112 that slides along a first shaft 121 of the driving unit 12, a plurality of pairs of arms 113 (in this embodiment, three pairs) extending downward from the respective both Lengthwise end portions and a central portion of the sliding unit 112, and a chuck 114 extending generally parallel to the sliding unit 112, and disposed to connect lower end portions of the arms 113.

The retainer main bodies 111 are pivotally attached to the sliding unit 112, such that the chucks 14 opposing the pair of retainer main bodies 111 can move toward and away from each other.

Figure 3:
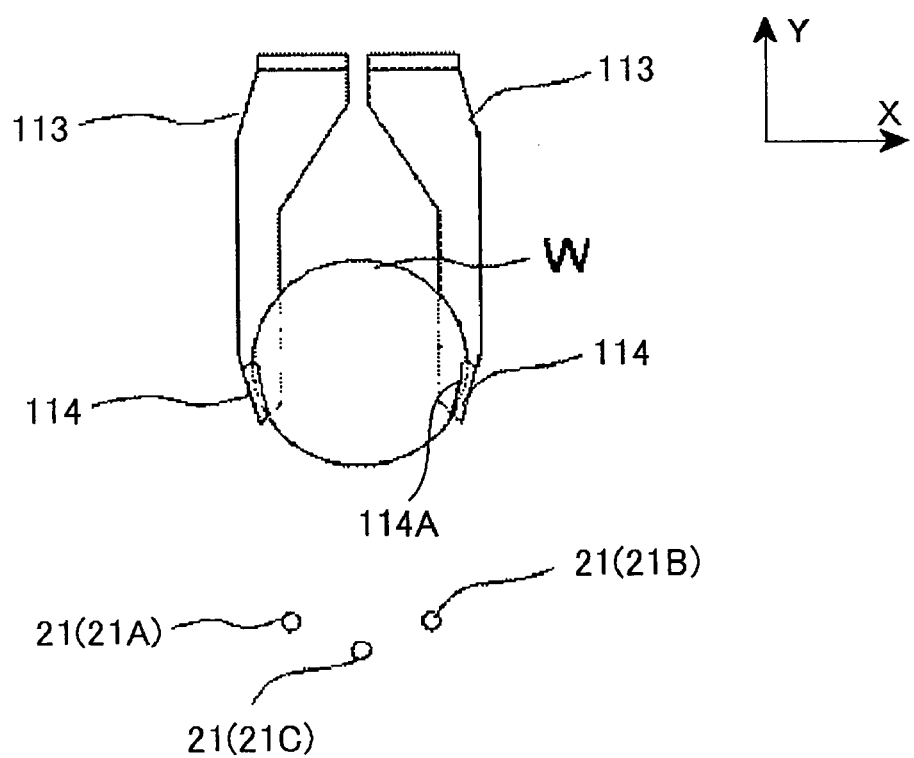
FIG. 3 is a front view showing a principal part of a retainer of the carrying apparatus and the mounting rack.

The chuck 114 is comprised of many slots 114A formed lengthwise in a predetermined pitch (see FIG. 3). The wafers W are to be inserted in the slot 114A, and are retained by the chuck 114.

In this embodiment, the chuck 114 is configured to retain, for example, 25 sheets of wafers W between the adjacent arms 113. Accordingly, the retainer 11 of this embodiment is capable of conveying 50 sheets of wafers at a time.

The driving unit 12 serves to drive the retainer 11 three-dimensionally.

The driving unit 12 includes the first shaft 121 to which the sliding unit 112 of the retainer 11 is mounted, a carriage 122 to which an end portion of the shaft 121 is fixed, a support column 123 to which the carriage 122 is movably mounted, a carriage 124 fixed to an upper end portion of the support column 123, and a second shaft 125 on which the carriage 124 is mounted.

The first shaft 121 extends in a Z-axis direction (horizontal direction and orthogonal to an alignment direction of the baths 3). The sliding unit 112 of the retainer 11 is driven by a motor (not shown), so as to slide on the first shaft 121 in the Z-axis direction.

The support column 123 extends in a Y-axis direction (vertical direction), and the carriage 122 moves vertically (Y-axis direction) on the support column 123. In this embodiment, the support column 123 is constituted of a ball screw, so that rotating the support column 123 with a motor M causes the carriage 122 to move vertically (Y-axis direction) on the support column 123. The movement of the carriage 122 on the support column 123 causes the retainer 11 to move up and downward.

The second shaft 125 extends in an X-axis direction (horizontal direction and in the alignment direction of the baths 3), so that the carriage 124 moves on the second shaft 125 in the X-axis direction.

The second shaft 125 is also constituted of a ball screw, so that driving a motor (not shown) to rotate the second shaft 125 causes the carriage 124 to move in the X-axis direction. The movement of the carriage 124 on the second shaft 125 causes the retainer 11 to move in the X-axis direction.

Here, the respective motors are controlled by a control unit 13. To the control unit 13, a storage unit 14 is connected.

The carrying apparatus 1 drives the motors via the control unit 13 based on data stored in the storage unit 14, to thereby adjust a position of the retainer 11.

The wafer boat 2 serves to support a plurality of wafers W, and is located in the bath 3, such as a wet etching bath or a pure water cleaning bath.

Figure 1:
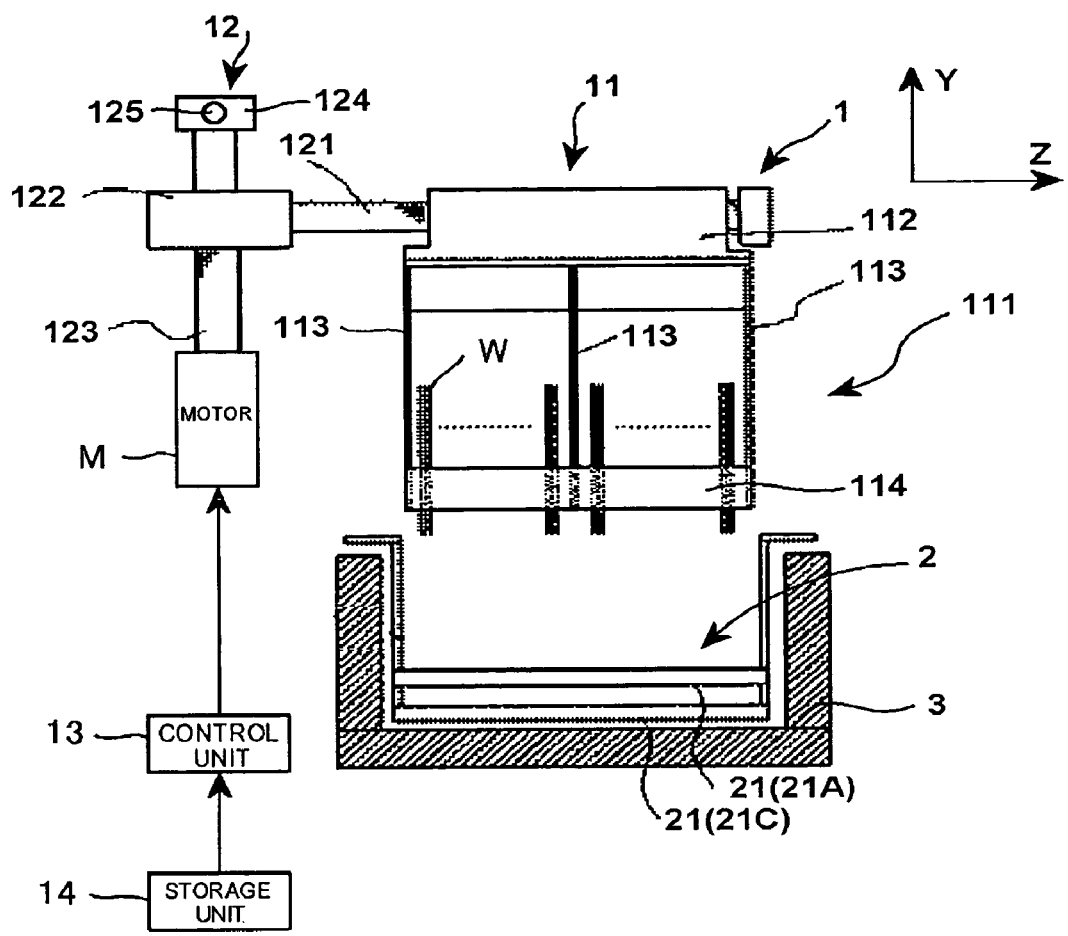
FIG. 1 is a schematic diagram showing a carrying apparatus and a mounting rack according to an embodiment of the present invention.

The wafer boat 2 includes three support rods 21 as shown in FIGS. 1 and 3. Out of the support rods 21, two support rods 21A, 21B are located at a generally same height from a bottom portion of the bath 3. The remaining support rod 21C is located between the two support rods 21A, 21B, and at a lower level than the two support rods 21A, 21B (see FIG. 3).

Accordingly, when the three support rods 21A to 21C are viewed from a position on a lengthwise extension thereof, a curve that connects the three support rods 21A to 21C forms an arcuate shape. Such arc generally fits an arc of the wafer W.

The three support rods 21A to 21C respectively include a plurality of slots 211 (see FIG. 8) formed in a predetermined pitch, so that when an outer circumferential portion of the wafer W is inserted in the slot 211 the wafer W is supported by the support rod 21 (21A to 21C).

In addition, the slots 211 are aligned in the same pitch as the slots 114A on the chuck 114.

A method of carrying the wafer W with the carrying apparatus 1 will now be described hereunder.

Firstly a plurality of sheets of wafers W are set to be retained by the chuck 114 of the retainer 11 of the carrying apparatus 1.

Then the driving unit 12 drives the carriage 124 so as to move along the second shaft 125. After that, the sliding unit 112 of the retainer 11 is driven to slide along the first shaft 121, so that the retainer 11 is located above one of the baths 3 (see FIG. 1).

Figure 4:
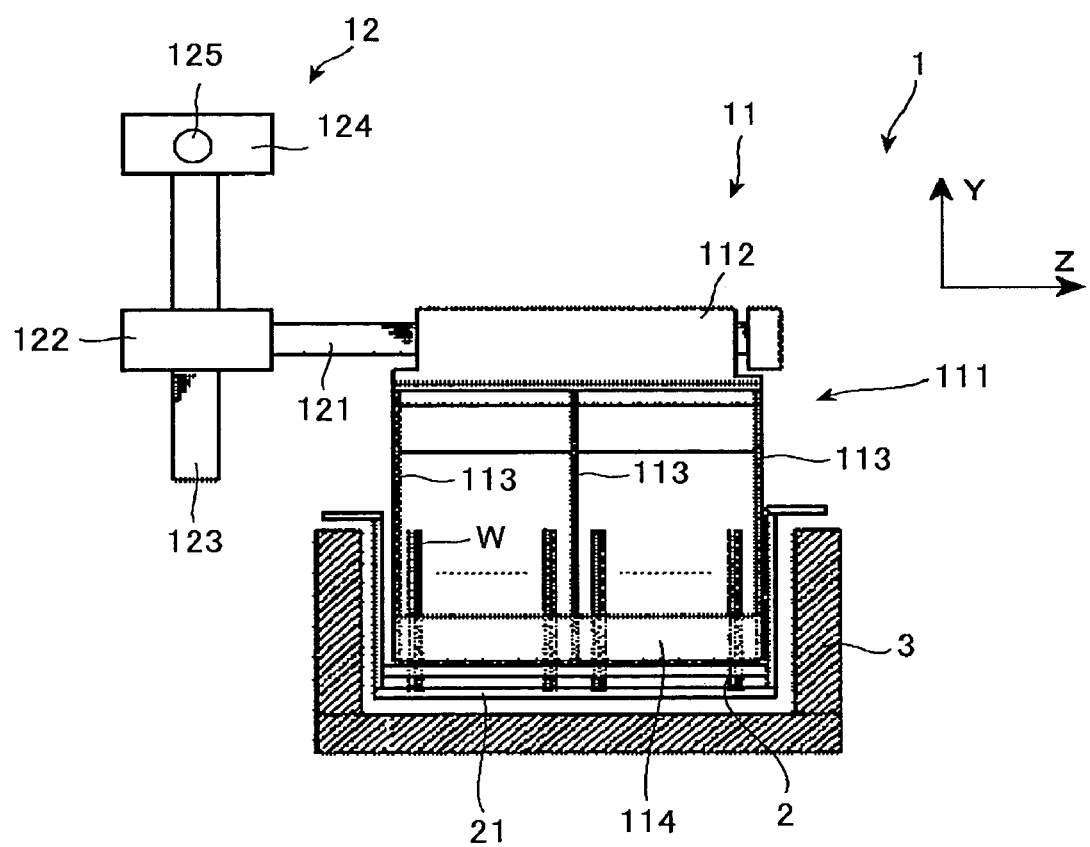
FIG. 4 is a schematic diagram showing the retainer of the carrying apparatus descended onto the mounting rack.
Figure 5:
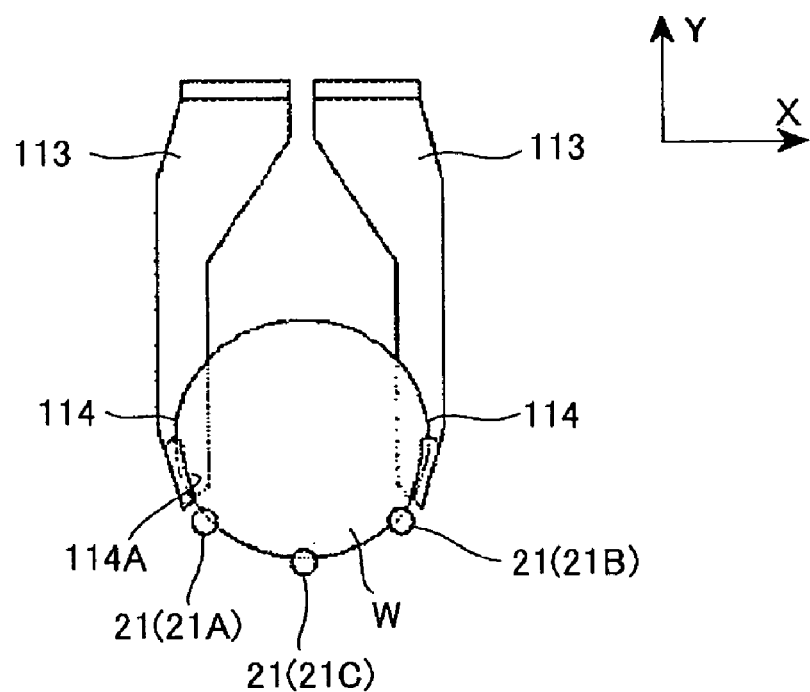
FIG. 5 is a schematic diagram showing the retainer of the carrying apparatus descended onto the mounting rack.

Referring now to FIGS. 4 and 5, the carriage 122 is driven to move downward along the support column 123, so as to insert the wafers W retained by the retainer 11 in the slots 211 of the support rod 21 of the wafer boat 2.

Figure 6:
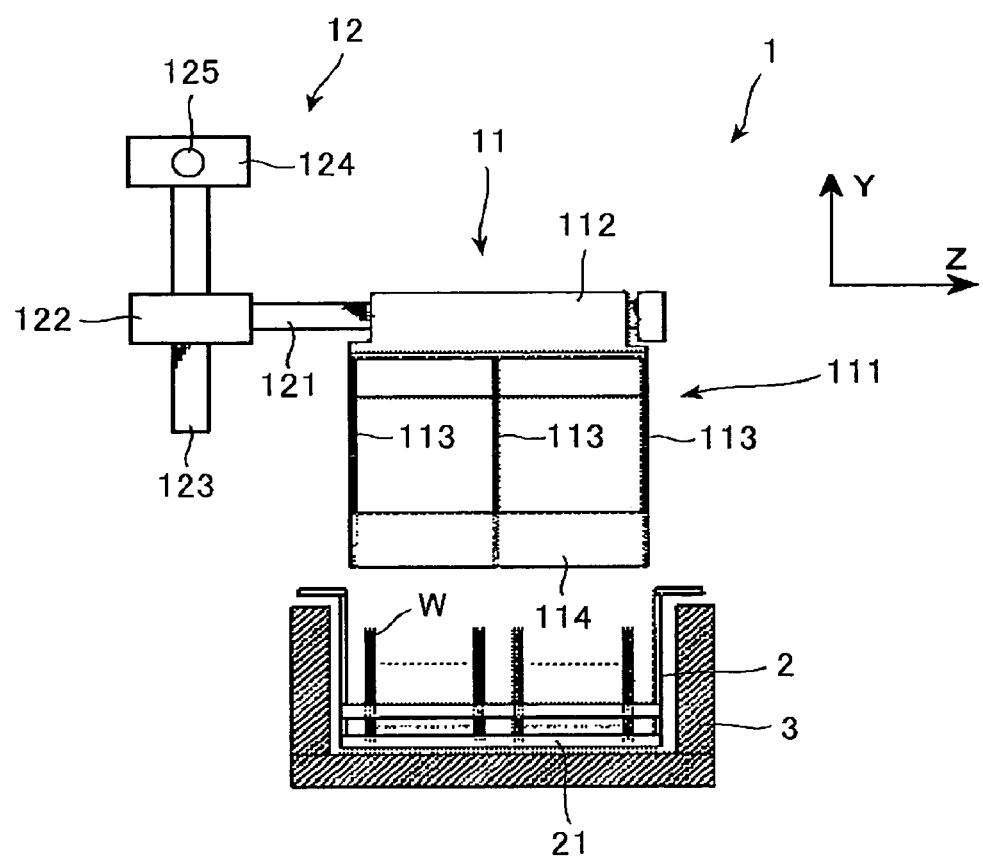
FIG. 6 is a schematic diagram showing the retainer of the carrying apparatus lifted above the mounting rack.
Figure 7:
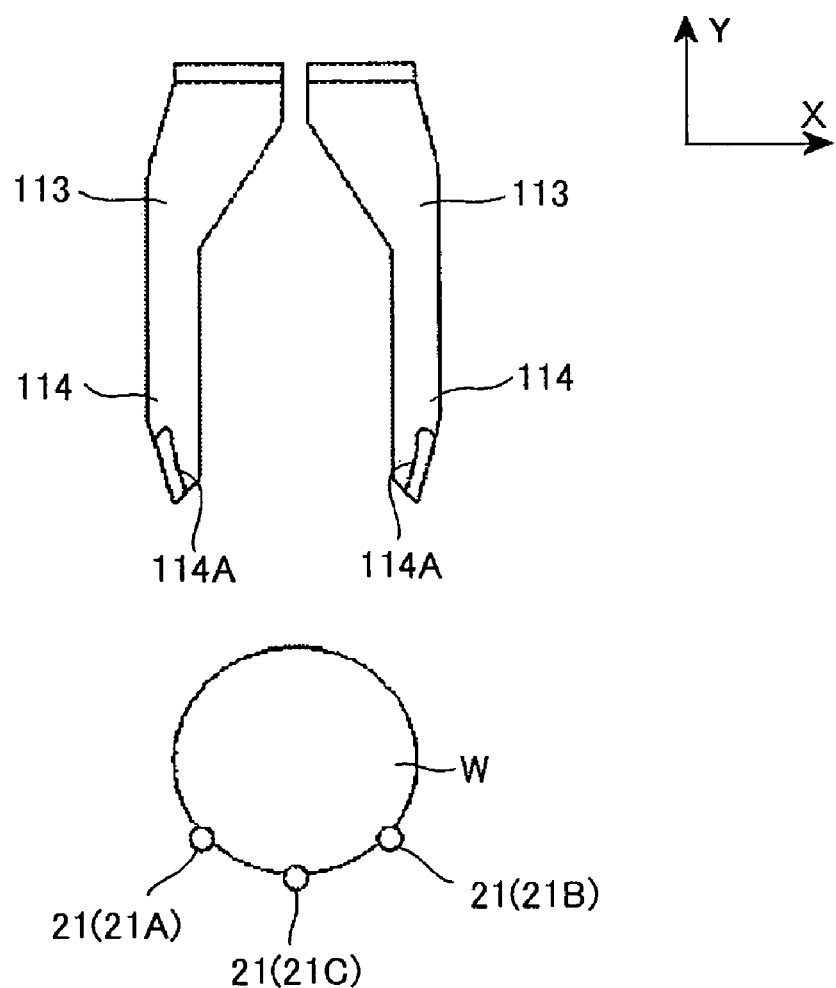
FIG. 7 is a schematic diagram showing the retainer of the carrying apparatus lifted above the mounting rack.

Then as shown in FIGS. 6 and 7, the chuck 114 of the retainer 11 releases the wafers W, and the carriage 122 is driven to move upward along the support column 123.

At this stage, the wafers W are set in the bath 3.

It should be noted that the motor M, the control unit 13, and the storage unit 14 are not shown in FIGS. 4 and 6.

When thus setting the wafers W on the wafer boat 2 with the foregoing carrying apparatus 1, it is essential to correctly insert the wafers W in the slots 211 of the wafer boat 2.

Also when removing the wafers W from the wafer boat 2, it is essential to correctly insert the wafers W in the slots 114A on the chuck 114.

For such purpose, a teaching apparatus 5 shown in FIGS. 8 to 14 is employed, so as to teach the carrying apparatus 1 a target position at which the retainer 11 is to make access to the wafer boat 2.

Now referring to FIGS. 8 to 14, details of the teaching apparatus 5 will be described.

Also, the teaching apparatus 5 and the foregoing carrying apparatus 1 constitute a teaching system.

An outline of the teaching apparatus 5 will be first described.

Figure 11:
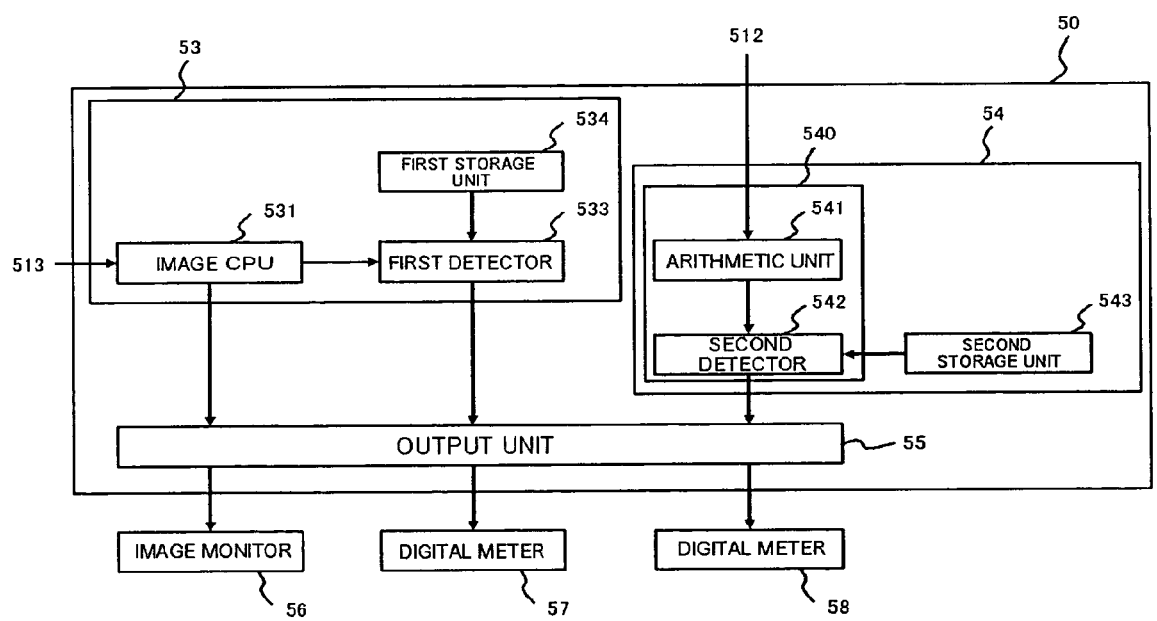
FIG. 11 is a functional block diagram showing an information processing unit of the carrying apparatus.

The teaching apparatus 5 includes a first member 51 held by the retainer 11 of the carrying apparatus 1 instead of the wafer W, a second member 52 attached to the wafer boat 2 so as to oppose the first member 51 held by the retainer 11 when the retainer 11 is set close to the target position, an output unit 55 (See. FIG. 11), an arithmetic unit 540, a first storage unit 534, and a first detector 533.

The first member 51 includes a distance sensor 512 that generates a sensor signal representing a distance between the distance sensor 512 and a surface of the second member 52 opposing the first member 51.

On the surface of the second member 52 opposing the first member 51, a reference mark A (see FIG. 9) is provided.

The first member 51 includes an imaging device 513 that shoots an image including the reference mark A, and generates image data.

The arithmetic unit 540 calculates a distance represented by the sensor signal, based on the sensor signal generated by the distance sensor 512.

The first storage unit 534 stores therein a position of the reference mark in the image shot by the imaging device 513 when the retainer 11 is set at the target position.

The first detector 533 detects a difference in a position of the reference mark A in the image obtained from the image data generated by the imaging device 513 and a position of the reference mark stored in the first storage unit 534.

The output unit 55 outputs a calculation result given by the arithmetic unit 540 and a detection result given by the first detector 533.

Hereunder, detailed description of the teaching apparatus 5 will be given.

Figure 8:
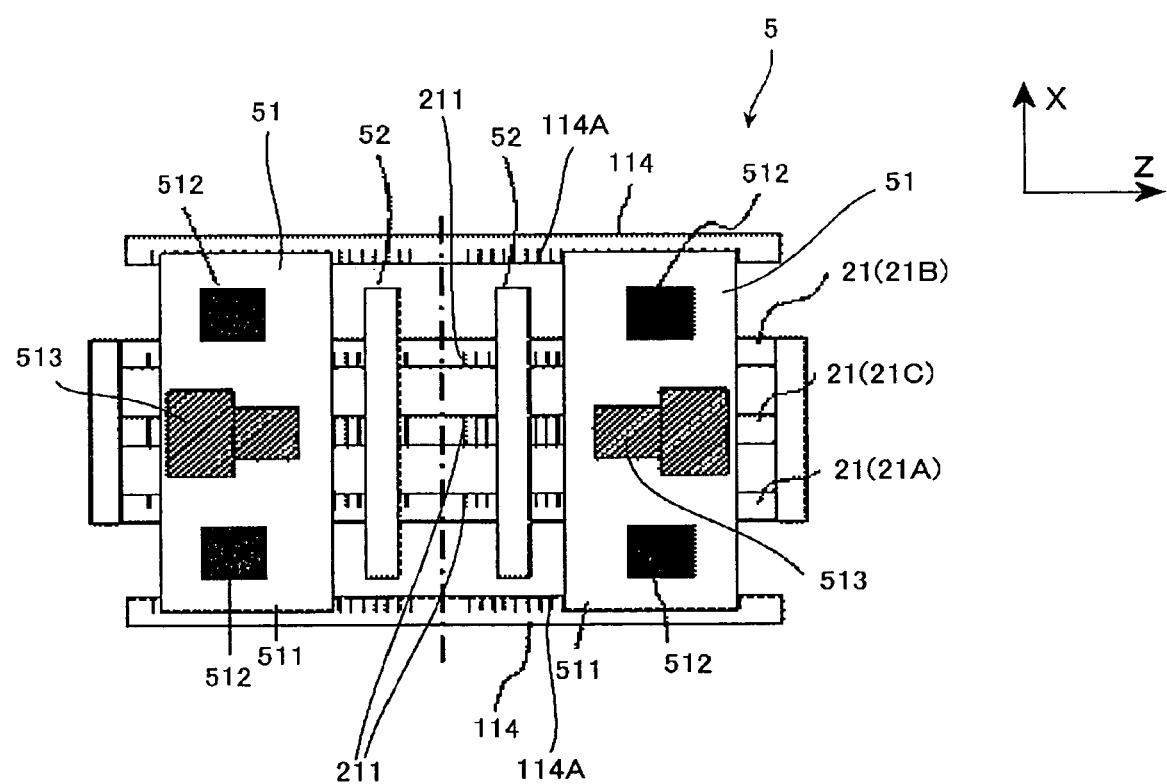
FIG. 8 is a plan view showing a chuck of the carrying apparatus, a part of the teaching apparatus, and the mounting rack.

Referring to FIG. 8, the teaching apparatus 5 according to this embodiment includes a plurality (for instance, two) of first members 51 and a plurality (for instance, two) of second members 52. Here, the first member 51 and the second member 52 work in a pair.

Also, FIG. 8 is a plan view showing the wafer boat 2 and a part of the teaching apparatus 5. FIG. 8 also depicts the chuck 114 out of the retainer 11 of the carrying apparatus 1.

Figure 9:
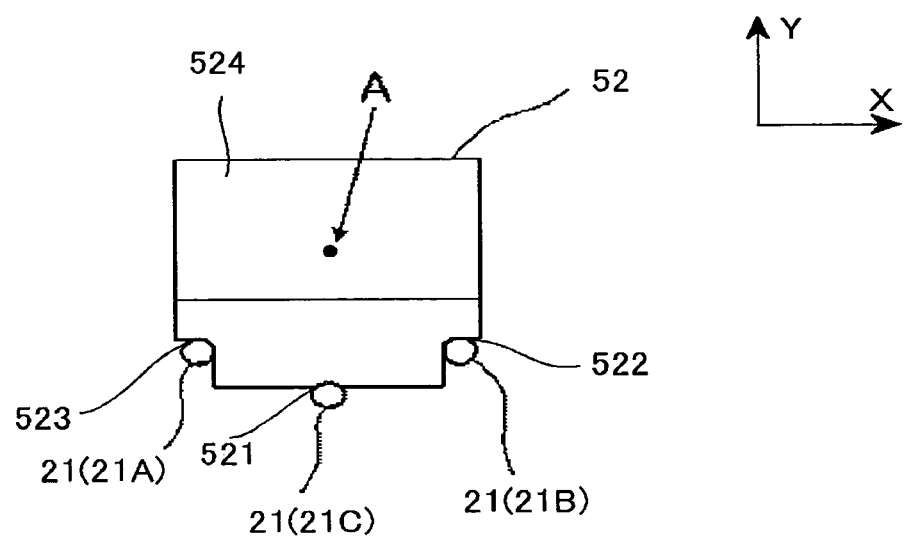
FIG. 9 is a front view showing a second member.

The second member 52 is, as shown in FIG. 9, attached to the three support rods 21A to 21C of the wafer boat 2.

The second member 52 is of a plate shape and erected on the wafer boat 2. The second member 52 includes, at a lower portion thereof, cutaway portions 521 to 523 that respectively fit the support rods 21A to 21C, so that when the support rods 21A to 21C are engaged with the cutaway portions 521 to 523 the second member 52 is erected on the wafer boat 2.

A surface 524 of the second member 52 (surface 524 that opposes the first member 51 when the retainer 11 is set close to the target position) is flat and smooth, and includes the reference mark A at a generally central portion thereof.

Figure 10:
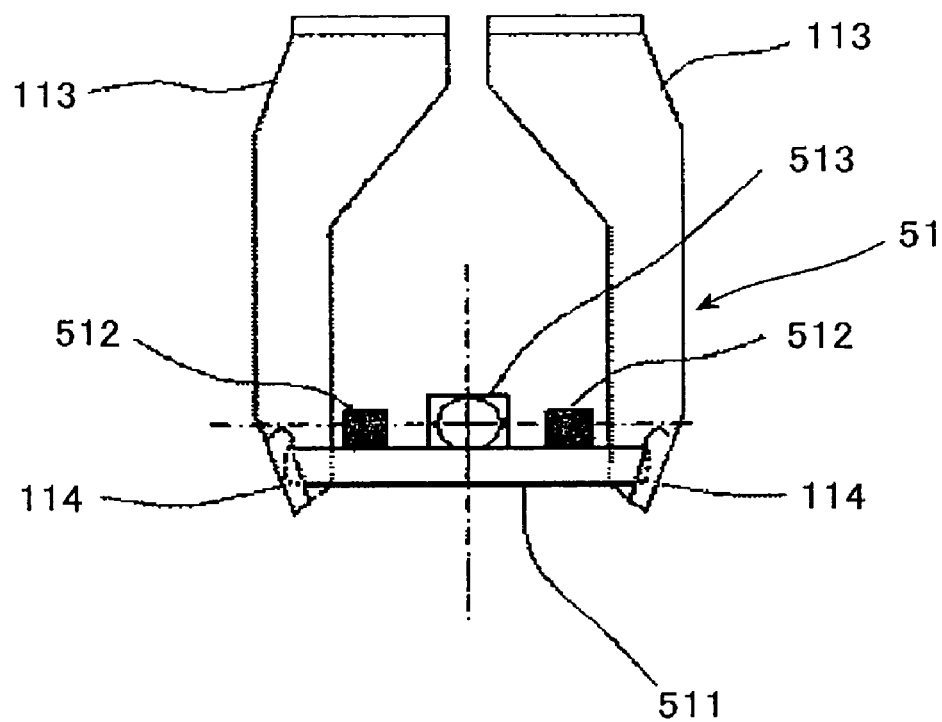
FIG. 10 is a front view showing a first member held by the chuck of the carrying apparatus.

The first member 51 includes, as shown in FIG. 10, a sensor mounting plate 511 held by the retainer 11, a pair of distance sensors 512 mounted on the sensor mounting plate 511, and the imaging device 513.

The sensor mounting plate 511 is of a plate shape and includes a projection (not shown) to be inserted in the slot 114A on the chuck 114 of the retainer 11, formed on a lateral side of the sensor mounting plate 511. Inserting the projection in the slot 114A causes the sensor mounting plate 511 to be held by the retainer 11.

At a generally central portion of the upper surface of the sensor mounting plate 511, the imaging device 513 is attached.

The imaging device 513 includes an image pickup device such as a CCD camera and circuits such as an A/D converter.

The imaging device 513 shoots the opposing surface 524 of the second member 52 when the retainer 11 is set close to the target position, and generates the image data.

The distance sensors 512 are located on the respective sides of the imaging device 513, with the imaging device 513 placed therebetween. The distance sensors 512 generate a sensor signal, based on which a distance between the distance sensor 512 and the opposing surface 524 of the second member 52 is to be obtained when the retainer 11 is set close to the target position.

Preferable examples of the distance sensor 512 include an optical displacement sensor that emits a beam from a light emitting device such as an LED or a semiconductor laser to the opposing surface 524, and receives the beam diffuse-reflected by the opposing surface 524 with an optical position detector, thereby measuring a distance.

Alternatively, the distance sensor 512 may be an eddy-current displacement sensor.

The eddy-current displacement sensor includes an internal coil, through which a high-frequency current is supplied to generate a high-frequency magnetic field. When the opposing surface 524 enters such high-frequency magnetic field (it is herein assumed that the opposing surface 524 is made of a metal), an eddy current is generated on the surface of the opposing surface 524 by an electromagnetic induction effect. The distance between the sensor and the opposing surface 524 can be then measured according to the magnitude of the eddy-current.

Further, the distance sensor 512 may be an ultrasonic displacement sensor that emits an ultrasonic wave toward the opposing surface 524, so as to measure the distance between the sensor and the opposing surface 524 based on a time the ultrasonic wave returns as a reflected wave from the opposing surface 524.

Referring now to FIG. 11, the teaching apparatus 5 includes an information processing unit 50 connected to the imaging device 513 and the distance sensor 512.

The information processing unit 50 includes an image processing unit 53, a distance data processing unit 54, and an output unit 55.

The image processing unit 53 includes an image CPU 531, a first detector 533, and a first storage unit 534.

The image data from the imaging device 513 is processed through the image CPU 531. Then the image is output to the image monitor 56 through the output unit 55, as an imaging result based on the image data generated by the imaging device 513.

The image monitor 56 is provided with a mark (not shown) indicating a position of the reference mark A defined when the retainer 11 is set at the target position.

The image data from the imaging device 513 is transmitted to the first detector 533 via the image CPU 531. The first detector 533 is connected to the first storage unit 534. The first storage unit 534 stores therein a position (coordinate value) of the reference mark A in the image shot when the retainer 11 is set at the target position.

The first detector 533 detects a difference in the position of the reference mark A in the image obtained from the image data generated by the imaging device 513 and the position of the reference mark A stored in the first storage unit 534.

The difference detected by the first detector 533 is output as the imaging result based on the image data generated by the imaging device 513, to the digital meter 57 through the output unit 55.

Here, the image processing unit 53, the image monitor 56, and the digital meter 57 are provided in accordance with the number of the imaging devices 513, in the teaching apparatus 5. Since the teaching apparatus 5 includes two imaging devices 513 in this embodiment, two each of the image processing units 53, the image monitors 56, and the digital meters 57 are provided.

The distance data processing unit 54 includes a calculation unit 541, a second detector 542, and a second storage unit 543.

The calculation unit 541 and the second detector 542 constitute the arithmetic unit 540.

The calculation unit 541 calculates a distance represented by a sensor signal based on the sensor signal generated by the distance sensor 512.

The distance calculated by the calculation unit 541 is transmitted to the second detector 542.

To the second detector 542, the second storage unit 543 is connected. The second storage unit 543 stores therein the distance between the distance sensor 512 and the opposing surface 524 of the second member 52, defined when the retainer 11 is set at the target position.

The second detector 542 detects a difference between the distance calculated based on the sensor signal from the distance sensor 512 and the distance stored in the second storage unit 543.

Such difference is output as a calculation result from the arithmetic unit 540, to the digital meter 58 through the output unit 55.

Here, the distance data processing unit 54 and the digital meter 58 are provided in accordance with the number of the distance sensor 512, in the teaching apparatus 5. Since the teaching apparatus 5 includes four distance sensors 512 in this embodiment, four each of the distance data processing unit 54 and the digital meter 58 are provided.

Hereunder, a teaching method based on the teaching apparatus 5 thus configured will now be described.

Figure 12:
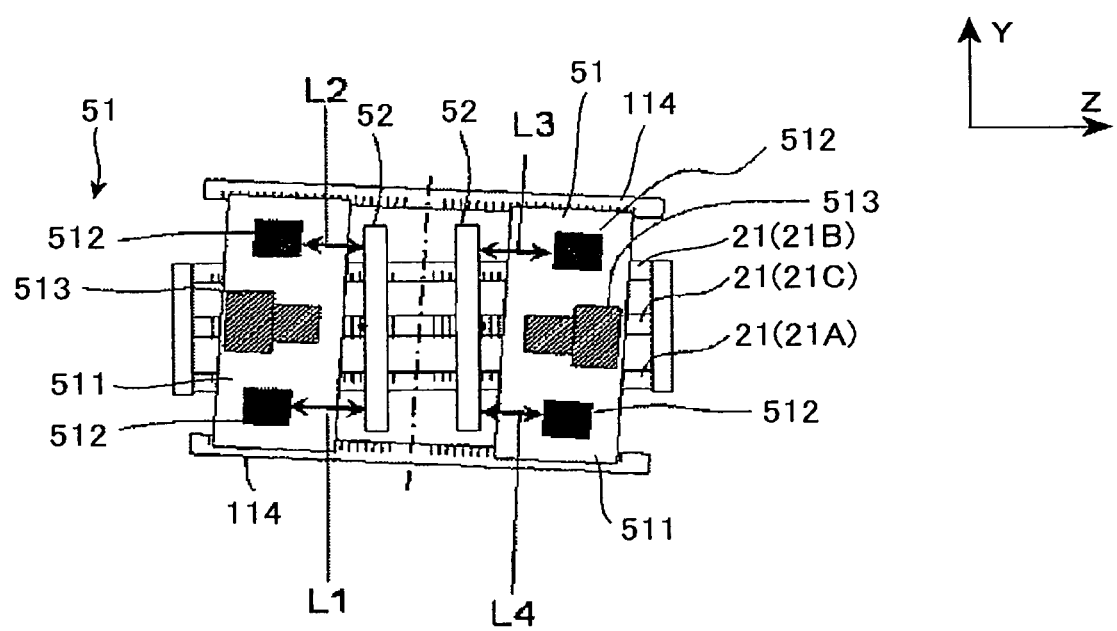
FIG. 12 is a plan view showing the chuck of the carrying apparatus, a part of the teaching apparatus, and the mounting rack.

Referring first to FIG. 12, a pair of second members 52 is attached to predetermined positions on the wafer boat 2. In this embodiment, the second members 52 are respectively attached to positions spaced by an equal distance from a lengthwise central portion of the support rod 21.

Then the retainer 11 is caused to hold a pair of first members 51 at a predetermined position thereof.

After that, the retainer 11 is set close to the target position, thereby placing the first member 51 and the second member 52 so as to oppose each other. At this stage, as shown in FIG. 13, a lengthwise direction of the chuck 14 of the retainer 11 and a lengthwise direction of the support rod 21 are not parallel to each other, but shifted by an angle θ.

Figure 13:
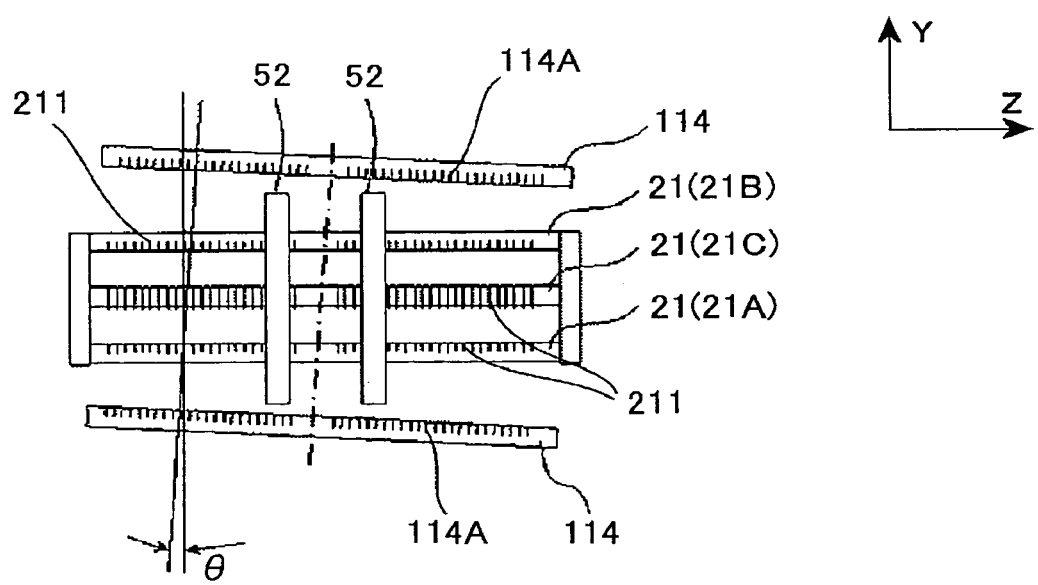
FIG. 13 is a plan view showing a principal part of FIG. 12.

Here, for the sake of visual explicitness, FIG. 13 does not show the first member 51.

The distance sensor 512 then measures the distance between the distance sensor 512 and the opposing surface 524 of the second member 52 (L1 to L4).

The sensor signals from the respective distance sensors 512 are transmitted to the calculation unit 541, so that the calculation unit 541 calculates, upon receipt of the sensor signals, the distance represented by the sensor signal. The distance calculated by the calculation unit 541 is transmitted to the second detector 542. The second detector 542 detects, upon acquiring the distance calculated by the calculation unit 541, a difference between the distance represented by the sensor signal from the distance sensor 512 and the distance stored in advance in the second storage unit 543.

The difference is then output through the output unit 55, and such teaching is displayed on the digital meter 58.

The operator adjusts the position of the retainer 11 based on the value displayed on the digital meter 58, repeating the adjustment until the difference displayed on the digital meter 58 becomes zero.

Figure 14:
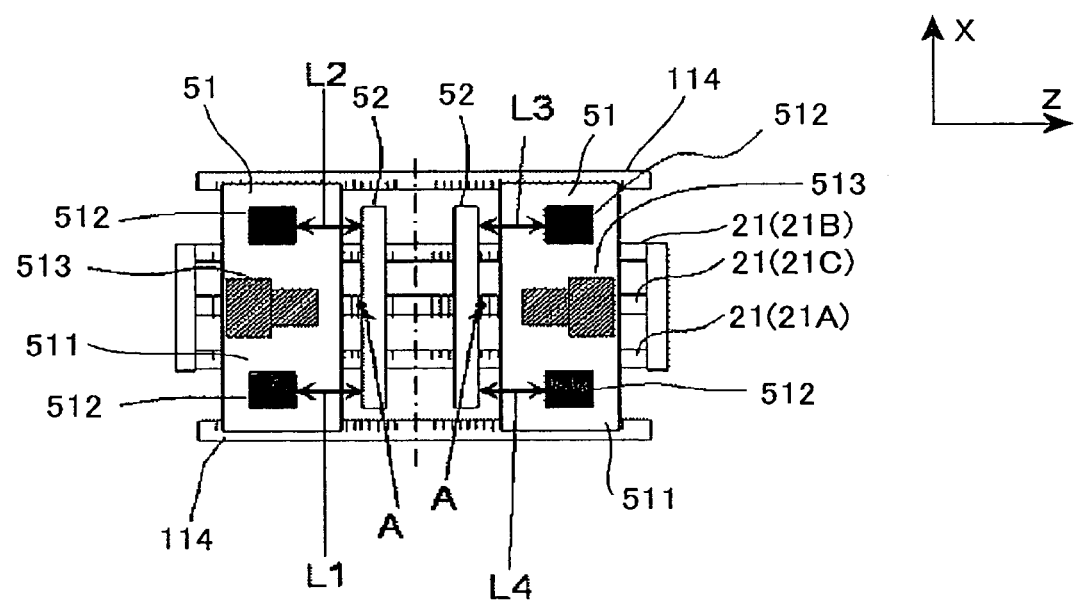
FIG. 14 is a plan view showing a chuck of the carrying apparatus, a part of the teaching apparatus, and the mounting rack.
Figure 15:
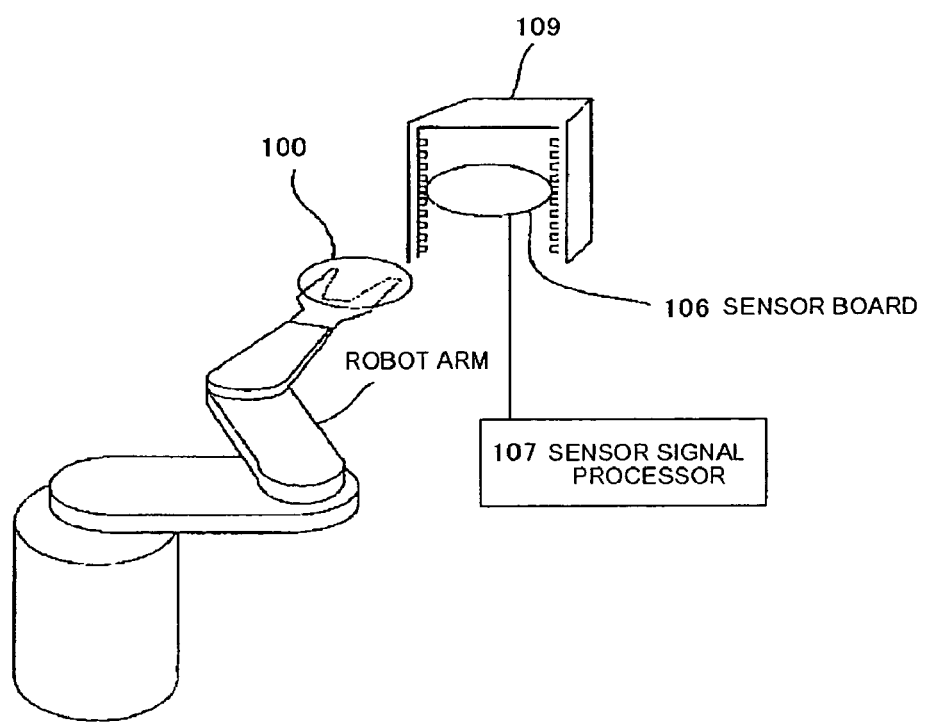
FIG. 15 is a schematic perspective view showing a conventional automatic teaching apparatus.
Figure 16:
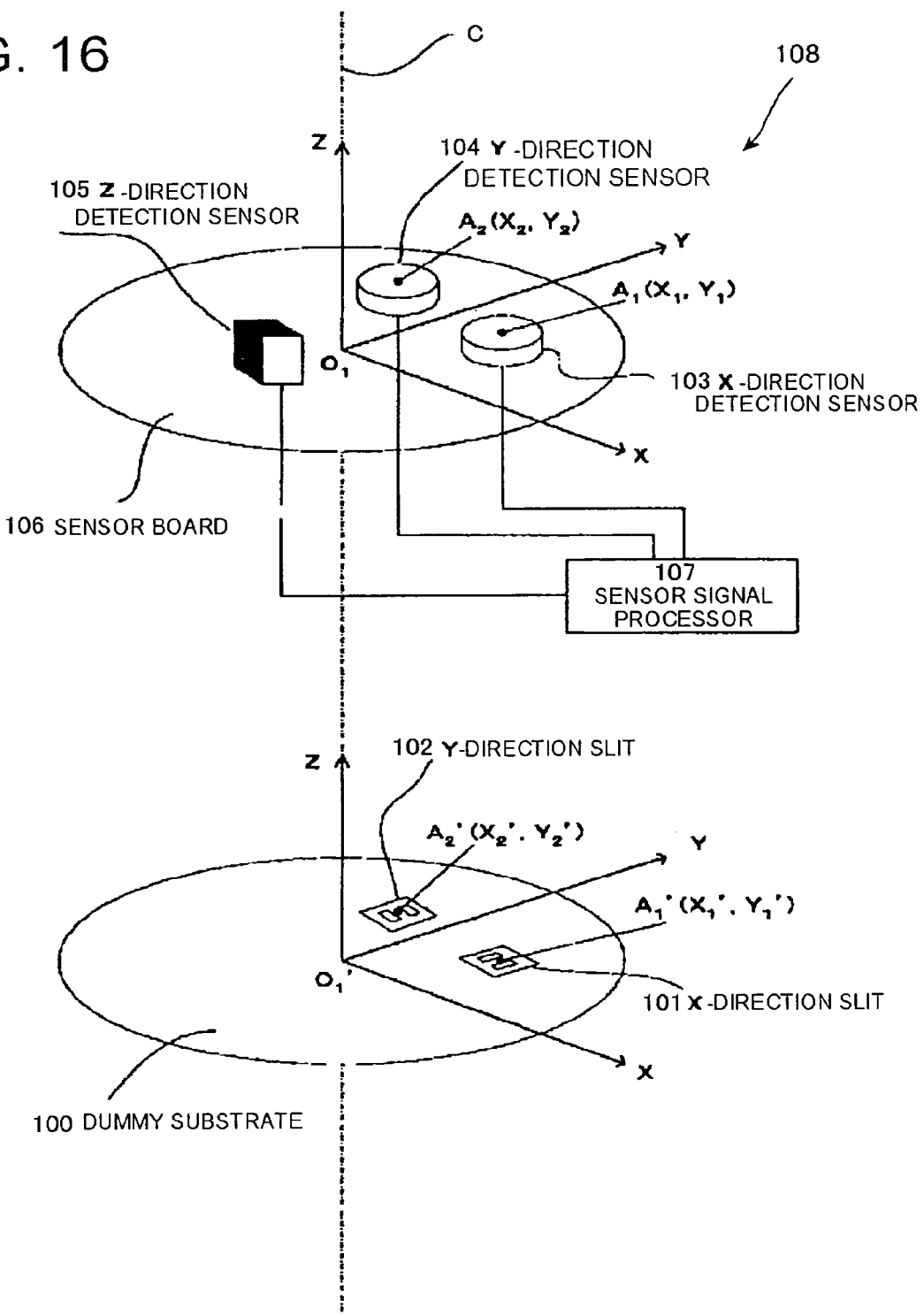
FIG. 16 is a schematic diagram showing a principal part of the conventional automatic teaching apparatus.

When the values displayed on the respective digital meters 58 become zero, the lengthwise direction of the support rod 21 and that of the chuck 114 become parallel to each other, and the positioning of the retainer 11 in the Z-axis direction is completed (see FIG. 14).

Thereafter, an image including the reference mark A provided on the opposing surface 524 of the second member 52 is shot with the imaging device 513.

The image data generated by the imaging device 513 is transmitted to the first detector 533 via the image CPU 531. The first detector 533 detects, upon acquiring the image data, a difference in a position (coordinate (x, y)) of the reference mark A in the image obtained from the image data generated by the imaging device 513 and the position of the reference mark A (coordinate (x, y)) stored in the first storage unit 534. Such difference is displayed on the digital meter 57 through the output unit 55.

Based on the difference displayed on the digital meter 57, the operator adjusts the position of the retainer 11, repeating the adjustment until the difference displayed on the digital meter 57 becomes zero.

At this stage, the positioning of the retainer 11 in the X-axis direction and the Y-axis direction is completed.

The position of the retainer 11, which has now been correctly adjusted, is stored in the storage unit 14 of the carrying apparatus 1.

The following explains advantageous effects of the teaching apparatus 5 according to this embodiment.

The first member 51 includes the distance sensor 512 for acquiring the distance between the distance sensor 512 and the opposing surface 524 of the second member 52. The difference between the measured distance acquired via the distance sensor 512 and the distance between the distance sensor 512 and the opposing surface 524 defined when the retainer 11 is set at the target position is detected, and the position of the retainer 11 is adjusted such that the difference becomes zero. This process enables the positioning in a direction orthogonal to the opposing surface 524 of the second member 52, i.e. the positioning of the retainer 11 in the Z-axis direction.

Since the first member 51 includes two distance sensors 512 in this embodiment, the accuracy in positioning the retainer 11 in the Z-axis direction is further enhanced.

Also, in this embodiment the second detector 542 detects the difference between the measured distance acquired via the distance sensor 512 and the distance between the distance sensor 512 and the opposing surface 524 defined when the retainer 11 is set at the target position. Such difference is displayed on the digital meter 58 through the output unit 55. Such arrangement significantly facilitates the positioning process of the retainer 11 in the Z-axis direction.

Further, the first member 51 includes the imaging device 513 that shoots the reference mark A provided on the opposing surface 524 of the second member 52.

The first detector 533 detects a difference in the position of the reference mark A in the image based on the image data from the imaging device 513 and the position of the reference mark A in the image shot when the retainer 11 is set at the target position Based on the detection result the position adjustment of the retainer 11 is executed. Such arrangement enables correct positioning of the retainer 11 in the opposing surface 524 (i.e. in the X-Y plane).

Still further, in this embodiment the first detector 533 detects a difference in a position of the reference mark A in the image obtained from the image data generated by the imaging device 513 and the position of the reference mark A in the image shot when the retainer 11 is set at the target position. Such difference is displayed on the digital meter 57. Such arrangement further enhances the positioning accuracy of the retainer 11, as compared with the case of adjusting the position of the retainer 11 solely based on the image displayed on the image monitor 56.

In addition, the image monitor 56 includes a mark indicating the position of the reference mark A defined when the retainer 11 is set at the target position. This allows the operator to execute the positioning of the retainer 11 not only based on the display on the digital meter 57 but also based on the image monitor 56, thereby significantly facilitating the positioning job for the retainer 11.

In the case where the teaching apparatus 5 is only provided with the imaging device 513 with the exclusion of the distance sensor 512, it becomes difficult to accurately adjust the position of the retainer 11 in the Z-axis direction. Even though the position of the reference mark A in the image based on the image data generated by the imaging device 513 and the position of the reference mark A in the image shot when the retainer 11 is set at the target position are matched, the chuck 114 may not be oriented parallel to the support rod 21 or the position in the Z-axis direction may not be correct to the target position, which leads to erroneous positioning of the retainer 11 in the Z-axis direction.

Likewise, in the case where the teaching apparatus 5 is only provided with the distance sensor 512 with the exclusion of the imaging device 513, it becomes difficult to accurately adjust the position of the retainer 11 in the Y-axis direction and the X-axis direction.

Providing the teaching apparatus 5 with both of the imaging device 513 and the distance sensor 512 according to this embodiment enables accurately adjusting the position of the retainer 11 in the three directions, namely the X-axis direction, the Y-axis direction, and the Z-axis direction.

Also, providing the teaching apparatus 5 with a plurality of first members 51 and a plurality of second members 52 further enhances the positioning accuracy of the retainer 11.

Further, in this embodiment the retainer 11 is set at the target position utilizing the distance sensor 512 and the imaging device 513, unlike the conventional technique of employing a dummy substrate with slits. This saves the process of forming the slits with high accuracy, thereby minimizing troublesome steps in the manufacturing process of the teaching apparatus.

Further, the distance sensor 512 and the imaging device 513 are employed for setting the retainer 11 at the target position. Hence employing the distance sensor 512 and the imaging device 513 of a high precision grade enables setting the retainer 11 at the target position with high accuracy.

It is to be understood that the present invention is not limited to the foregoing embodiment, and that modifications and improvement that allow achieving the object of the present invention are included in the scope of the present invention.

To cite a few examples, although the first member 51 includes the distance sensor 512 and the imaging device 513, and the opposing surface 524 of the second member 52 includes the reference mark A according to the embodiment, the configuration of the teaching apparatus 5 is not limited to such embodiment. For example, the second member 52 may include the imaging device and a surface of the first member 51 opposing the second member 52 may be provided with the reference mark.

Also, the second member 52 may include the distance sensor.

Further, in the above embodiment, the output unit 55 outputs the detection result given by the second detector 542. However, the present invention is not limited to such embodiment. The output unit may also output the calculation result given by the arithmetic unit 541.

Further, although the teaching apparatus 5 includes the second detector 542 that detects a difference between the distance based on the sensor signal from the distance sensor 512 and the distance stored in the second storage unit 543 according to the embodiment, the configuration of the teaching apparatus 5 is not limited to such embodiment.

For example, the second detector 542 may be excluded from the teaching apparatus. The distance based on the sensor signal from the distance sensor 512 may be output as a calculation result given by the arithmetic unit to the digital meter, through the output unit.

In the case where the operator is made aware of the distance between the distance sensor 512 and the opposing surface 524 defined when the retainer 11 is set at the target position in advance, the operator can execute the positioning of the retainer 11 based on the measurement result output to the digital meter.

Further, according to the above embodiment the operator watches the digital meter and other displays so as to drive the retainer 11 of the carrying apparatus 1 based on the values displayed on the digital meter, to thereby adjust the position of the retainer 11. However, without limitation to such method, the output unit of the teaching apparatus may be set to output the calculation result and the imaging result to the carrying apparatus 1, for teaching those results. The carrying apparatus may include an acquisition unit that acquires the calculation result and the imaging result output by the output unit of the teaching apparatus, so that the control unit may control the driving unit of the carrying apparatus based on the calculation result and the imaging result acquired by the acquisition unit. Such arrangement enables execution of automatic positioning of the retainer 11. Then it is appropriate to store the position of the retainer 11 set upon completion of the positioning in the storage unit of the carrying apparatus.

In this case, there is provided a teaching system including a carrying apparatus having a retainer that holds an object to be carried, and a teaching apparatus to be used for teaching the carrying apparatus a target position at which the retainer is to make access to a mounting rack on which the object to be carried is to be placed, in which the carrying apparatus includes an acquisition unit that acquires a calculation result and an imaging result output by an output unit of the teaching apparatus, a driving unit that drives the retainer based on the calculation result and the imaging result acquired by the acquisition unit to thereby adjust a position of the retainer, and a storage unit that stores therein the adjusted position of the retainer.

Still further, although in the above embodiment the carrying apparatus 1 conveys a plurality of sheets of wafers W at a time, the carrying apparatus may convey the wafers sheet by sheet.

In addition, although the wafer boat 2 is configured such that the lengthwise direction of the support rod 21A to 21C is horizontally oriented in the above embodiment, the wafer boat 2 may be placed such that the lengthwise direction of the support rods 21A to 21C is vertically oriented instead.

It is apparent that the present invention is not limited to the above embodiment, and may be modified and changed without departing from the scope and spirit of the invention.

What is claimed is:

1. A teaching apparatus to be used for teaching a carrying apparatus a target position at which a retainer of said carrying apparatus holding an object to be carried is to make access to a mounting rack on which said object is to be placed, comprising:

a first member held by said retainer;
a second member attached to said mounting rack and disposed so as to oppose said first member held by said retainer when said retainer is located close to said target position;
an output unit; and
an arithmetic unit;
wherein at least one of said first member and said second member includes a distance sensor that generates a sensor signal representing a distance between said distance sensor and an opposing surface of the other member opposing said one member;
at least one of said opposing surface of the other member and the opposing surface of said one member opposing said opposing surface of the other member, is provided with a reference mark, and one of said first member and said second member which is opposing the member with said reference mark includes an imaging device that shoots an image including said reference mark and generates image data;
said arithmetic unit calculates the distance represented by said sensor signal based on said sensor signal generated by said distance sensor;
said output unit outputs a calculation result given by said arithmetic unit, and outputs a difference in a position of said reference mark obtained from said image data generated by said imaging device and a position of said reference mark in an image shot by said imaging device when said retainer is set at said target position.

2. A teaching apparatus to be used for teaching a carrying apparatus a target position at which a retainer of said carrying apparatus holding an object to be carried is to make access to a mounting rack on which said object is to be placed, comprising:

a first member held by said retainer;
a second member attached to said mounting rack and disposed so as to oppose said first member held by said retainer when said retainer is located close to said target position;
an output unit;
an arithmetic unit;
a first storage unit; and
a first detector;
wherein at least one of said first member and said second member includes a distance sensor that generates a sensor signal representing a distance between said distance sensor and an opposing surface of the other member opposing said one member;
at least one of said opposing surface of the other member and the opposing surface of said one member opposing said opposing surface of the other member, is provided with a reference mark, and one of said first member and said second member which is opposing the member with said reference mark includes an imaging device that shoots an image including said reference mark and generates image data;
said first storage unit stores a position of said reference mark in an image shot by said imaging device when said retainer is set at said target position;
said first detector detects a difference in a position of said reference mark obtained from said image data generated by said imaging device and said position of said reference mark stored in said first storage unit;
said arithmetic unit calculates the distance represented by said sensor signal based on said sensor signal generated by said distance sensor; and said output unit outputs a calculation result given by said arithmetic unit, and a detection result given by said first detector.

3. The teaching apparatus according to claim 2, further comprising:
a second storage unit that stores therein a distance between said distance sensor and said opposing surface of the other member defined when said retainer is set at said target position;
wherein said arithmetic unit includes a calculation unit that calculates said distance represented by said sensor signal based on said sensor signal generated by said distance sensor, and a second detector that detects a difference between said distance calculated by said calculation unit and said distance stored in said second storage unit; and
said output unit outputs a detection result given by said second detector, as a calculation result given by said arithmetic unit.

4. The teaching apparatus according to claim 2,
wherein said object to be carried is a wafer;
said mounting rack includes a support rod provided with a plurality of slots that support an outer circumferential portion of said wafer formed at a predetermined pitch;
said retainer holds a plurality of wafers in accordance with said pitch of said slots; and
said second member is attached to said support rod.

5. The teaching apparatus according to claim 2, comprising two or more of said distance sensors.

6. A method of teaching a carrying apparatus a target position at which a retainer of said carrying apparatus holding an object to be carried is to make access to a mounting rack on which said object is to be placed, comprising:
causing said retainer to hold a first member;
attaching a second member to said mounting rack;
moving and placing said retainer to the proximity of said target position so that said first member and said second member are oppose each other;
measuring, with a distance sensor provided to one of said first member and said second member, a distance between said distance sensor and a surface of the other member opposing said one member;
shooting a reference mark provided to at least one of said opposing surface of the other member and that of said one member opposing said opposing surface of the other member, and acquiring an image, with an imaging device provided to one of said first member and said second member which is opposing the member having said reference mark;
detecting a difference in said distance measured in said measuring a distance and said distance between said distance sensor and said opposing surface of the other member defined when said retainer is set at said target position;
detecting a difference in a position of said reference mark in said image acquired in said acquiring an image and a position of said reference mark in an image shot by said imaging device when said retainer is set at said target position;
adjusting said position of said retainer based on a detection result in said each detecting a difference; and
storing an adjusted position of said retainer in said carrying apparatus.

* * * * *